(12) United States Patent
Wang et al.

(10) Patent No.: US 11,450,721 B2
(45) Date of Patent: Sep. 20, 2022

(54) ARRAY SUBSTRATE INCLUDING PIXEL UNIT WITH SWITCHING TRANSISTOR AND DRIVING TRANSISTOR HAVING DIFFERENT THRESHOLD VOLTAGES FOR IMPROVING DISPLAY EFFECT, AND METHOD OF MANUFACTURING THE SAME

(71) Applicant: BOE TECHNOLOGY GROUP CO., LTD., Beijing (CN)

(72) Inventors: Dongfang Wang, Beijing (CN); Bin Zhou, Beijing (CN); Ce Zhao, Beijing (CN); Tongshang Su, Beijing (CN); Yuankui Ding, Beijing (CN); Ming Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 567 days.

(21) Appl. No.: 16/476,474

(22) PCT Filed: Sep. 21, 2018

(86) PCT No.: PCT/CN2018/107023
§ 371 (c)(1),
(2) Date: Jul. 8, 2019

(87) PCT Pub. No.: WO2019/157822
PCT Pub. Date: Aug. 22, 2019

(65) Prior Publication Data
US 2021/0335950 A1    Oct. 28, 2021

(30) Foreign Application Priority Data

Feb. 14, 2018  (CN) .......................... 201810151552.0

(51) Int. Cl.
| | | |
|---|---|---|
| *H01L 27/32* | (2006.01) | |
| *G09G 3/3233* | (2016.01) | |
| *H01L 51/56* | (2006.01) | |

(52) U.S. Cl.
CPC ....... *H01L 27/3262* (2013.01); *G09G 3/3233* (2013.01); *H01L 27/3276* (2013.01);
(Continued)

(58) Field of Classification Search
CPC . H01L 27/3262; H01L 27/3276; H01L 51/56; G09G 3/3233
(Continued)

(56) References Cited

U.S. PATENT DOCUMENTS

| 7,224,224 B2 | 5/2007 | Sera et al. |
| 7,382,340 B2 | 6/2008 | Kim et al. |

(Continued)

FOREIGN PATENT DOCUMENTS

| CN | 1490882 A | 4/2004 |
| CN | 1622167 A | 6/2005 |

(Continued)

OTHER PUBLICATIONS

First Chinese Office Action dated Jun. 5, 2019, received for corresponding Chinese Application No. 201810151552.0.
(Continued)

*Primary Examiner* — Matthew E. Gordon
(74) *Attorney, Agent, or Firm* — Kinney & Lange, P.A.

(57) ABSTRACT

The present disclosure provides a pixel unit, a method of manufacturing the same, and an array substrate. The pixel unit includes: a driving transistor, a switching transistor, and a light emitting element on a substrate; wherein the driving transistor has an input electrode electrically connected to a first power supply terminal and an output electrode electrically connected to a first terminal of the light emitting
(Continued)

element; the switching transistor has an input electrode electrically connected to a data line, a control electrode electrically connected to a scan line, and an output electrode electrically connected to a gate electrode of the driving transistor; wherein the switching transistor and the driving transistor have different threshold voltages.

17 Claims, 6 Drawing Sheets

(52) U.S. Cl.
CPC ..... *H01L 51/56* (2013.01); *G09G 2300/0809* (2013.01); *H01L 2227/323* (2013.01)

(58) Field of Classification Search
USPC .......................................................... 257/40
See application file for complete search history.

(56) References Cited

U.S. PATENT DOCUMENTS

| | | | |
|---|---|---|---|
| 7,595,533 B2 | 9/2009 | Sera et al. | |
| 7,824,952 B2 | 11/2010 | Choi et al. | |
| 8,890,778 B2 | 11/2014 | Shirouzu et al. | |
| 9,922,596 B2 | 3/2018 | Azizi et al. | |
| 10,304,875 B2 | 5/2019 | Lou et al. | |
| 10,319,798 B2 | 6/2019 | Tateishi et al. | |
| 10,546,529 B2 | 1/2020 | Kimura et al. | |
| 2008/0121872 A1 | 5/2008 | Choi et al. | |
| 2010/0270678 A1* | 10/2010 | Ikeda .................. | G09G 3/3233 257/773 |
| 2013/0193439 A1 | 8/2013 | Ahn et al. | |
| 2014/0192035 A1 | 7/2014 | Tai et al. | |
| 2017/0018226 A1 | 1/2017 | Yang et al. | |
| 2017/0033237 A1 | 2/2017 | Abe et al. | |
| 2017/0221925 A1* | 8/2017 | Lou ....................... | H01L 27/127 |
| 2019/0086701 A1 | 3/2019 | Xie et al. | |
| 2019/0237486 A1 | 8/2019 | Lou et al. | |

FOREIGN PATENT DOCUMENTS

| | | |
|---|---|---|
| CN | 101043047 A | 9/2007 |
| CN | 101872779 A | 10/2010 |
| CN | 101960509 A | 1/2011 |
| CN | 104036719 A | 9/2014 |
| CN | 104978932 A | 10/2015 |
| CN | 105552085 A | 5/2016 |
| CN | 106505071 A | 3/2017 |
| CN | 106783733 A | 5/2017 |
| CN | 107301840 A | 10/2017 |
| CN | 107515498 A | 12/2017 |
| CN | 108320705 A | 7/2018 |
| JP | 2010014942 A | 1/2010 |
| JP | 2010272845 A | 12/2010 |
| JP | 2013162120 A | 8/2013 |
| JP | 2017142524 A | 8/2017 |
| JP | 2017157843 A | 9/2017 |
| JP | 2019544013 A | 9/2018 |

OTHER PUBLICATIONS

International Search Report and English Translation of Box V of the Written Opinion dated Dec. 13, 2018, received for corresponding Chinese PCT Application No. PCT/CN2018/107023.
Examination Report dated Aug. 19, 2021 in corresponding Indian Application No. 201947034791 (5 pages).
English translation of Japanese Office Action dated Jun. 13, 2022, for corresponding Japanese Application No. 2019-544013.

* cited by examiner

ARRAY SUBSTRATE INCLUDING PIXEL UNIT WITH SWITCHING TRANSISTOR AND DRIVING TRANSISTOR HAVING DIFFERENT THRESHOLD VOLTAGES FOR IMPROVING DISPLAY EFFECT, AND METHOD OF MANUFACTURING THE SAME

CROSS-REFERENCE TO RELATED APPLICATION(S)

This application is a U.S. National Phase Application of International Application No. PCT/CN2018/107023, filed on Sep. 21, 2018, entitled "Pixel unit, method of manufacturing the same, and array substrate," which claims priority to a Chinese Patent Application No. 201810151552.0, entitled "Pixel unit, method of manufacturing the same and array substrate" and filed on Feb. 14, 2018, both of which are incorporated herein by reference in their entireties.

TECHNICAL FIELD

The present disclosure generally relates to the field of display technologies, and in particular, to a pixel unit, a method of manufacturing the same, and an array substrate.

BACKGROUND

Organic Light Emitting Diode (OLED) display devices are gaining more and more applications. Because of its display characteristics, the OLED display device needs to perform internal compensation or external compensation on the circuit to improve the display effect. However, there are many factors affecting the effect of the internal compensation or external compensation. How to improve the stability of the compensation to improve the display effect is an urgent problem to be solved.

SUMMARY

Embodiments of the present disclosure provide a pixel circuit, a method of manufacturing the same, an array substrate, and a display device.

According to an aspect of the present disclosure, a pixel circuit is provided, including: a driving transistor, a switching transistor, and a light emitting element on a substrate;

wherein the driving transistor has an input electrode electrically connected to a first power supply terminal, and an output electrode electrically connected to a first terminal of the light emitting element; the switching transistor has an input electrode electrically connected to a data line, a control electrode electrically connected to a scan line, and an output electrode electrically connected to a control electrode of the driving transistor; wherein the switching transistor has a different threshold voltage from that of the driving transistor.

For example, the switching transistor and the driving transistor are thin film transistors.

For example, each of the switching transistor and the driving transistor further includes:

an active layer; and an insulation layer, wherein the insulation layer comprises a first via and a second via, and the output electrode and the input electrode are electrically connected to the active layer through the first via and the second via, respectively, and wherein for at least one of the switching transistor and the driving transistor, the active layer is an axisymmetric pattern that is axisymmetric about a first symmetry axis.

For example, the difference between the minimum distance from the edge of the first via to the first symmetry axis and the minimum distance from the edge of the output electrode to the first symmetry axis is L1, and the difference between the minimum distance from the edge of the second via to the first symmetry axis and the minimum distance from the edge of the input electrode to the first symmetry axis is L2; and L1 is not equal to L2 for at least one of the switching transistor and the driving transistor.

For example, an orthographic projection of the first via on the substrate is located within an orthographic projection area of the output electrode and the active layer on the substrate, and an orthographic projection of the second via on the substrate is located within an orthographic projection area of the input electrode and the active layer on the substrate.

For example, a region in which orthographic projections of the output electrode and the active layer on the substrate are overlapped is a first overlap region, and a region in which orthographic projections of the input electrode and the active layer on the substrate are overlapped is a second overlap region, and wherein the first overlap region and the second overlap region are axisymmetric about the first symmetry axis.

For example, the first via and the second via are axisymmetric about the first symmetry axis.

For example, the output electrode and the input electrode are axisymmetric about the first symmetry axis.

For example, for the at least one of the switching transistor and the driving transistor, the first via and the second via are disposed such that $Vth=Vth0+A*(L1-L2)$, where $Vth0$ is a reference threshold voltage of the at least one transistor, $Vth$ is a threshold voltage of the at least one transistor, and $A$ is a constant greater than zero.

For example, one of L1 and L2 is in a range of 2.8 μm to 3.2 μm, and the other is in a range of 0.8 μm to 1.2 μm.

For example, the absolute value of the difference between L1 and L2 of one of the switching transistor and the driving transistor is greater than the absolute value of the difference between L1 and L2 of the other transistor.

For example, the difference between L1 and L2 of one of the switching transistor and the driving transistor is not zero, and the difference between L1 and L2 of the other transistor is zero.

For example, the control electrode is a gate electrode, the input electrode is a source electrode, and the output electrode is a drain electrode.

For example, the threshold voltage of the switching transistor is greater than the threshold voltage of the driving transistor.

According to another aspect of the embodiments of the present disclosure, an array substrate is provided, including:

a plurality of scan lines;

a plurality of data lines; and a plurality of pixel circuits according to the embodiments of the present disclosure arranged in an array.

According to another aspect of the embodiments of the present disclosure, a method of manufacturing a pixel circuit according to an embodiment of the present disclosure is provided, the method including:

forming a driving transistor, a switching transistor, and a light emitting element;

wherein forming at least one of the switching transistor and the driving transistor includes:

forming a gate electrode;

forming an active layer, the active layer being an axisymmetric pattern that is axisymmetric about a first symmetry axis;

forming an insulation layer;

forming a first via and a second via on the insulation layer; and forming an input electrode and an output electrode, wherein the forming the first via and the second via on the insulation layer includes: forming the first via and the second via by translating a mask for the etching barrier layer by a distance of |L1−L2|, wherein the difference between the minimum distance from the edge of the first via to the first symmetry axis and the minimum distance from the edge of the output electrode to the first symmetry axis is L1, and the difference between the minimum distance from the edge of the second via to the first symmetry axis and the minimum distance from the edge of the input electrode to the first symmetry axis is L2.

For example, one of L1 and L2 is in a range of 2.8 μm to 3.2 μm, and the other is in a range of 0.8 μm to 1.2 μm.

For example, the absolute value of the difference between L1 and L2 of one of the switching transistor and the driving transistor is greater than the absolute value of the difference between L1 and L2 of the other transistor.

For example, the difference between L1 and L2 of one of the switching transistor and the driving transistor is not zero, and the difference between L1 and L2 of the other transistor is zero.

According to another aspect of the embodiments of the present disclosure, a display device comprising an array substrate according to an embodiment of the present disclosure is provided.

BRIEF DESCRIPTION OF THE DRAWINGS

In order to more clearly illustrate the embodiments of the present disclosure or related technical solutions, the drawings used in the description of the embodiments will be briefly described below. It is apparent that the drawings in the following description are merely some embodiments of the present disclosure, and other drawings may be obtained by those skilled in the art based on these drawings without creative efforts. In the drawings.

DETAILED DESCRIPTION

Figure 1:
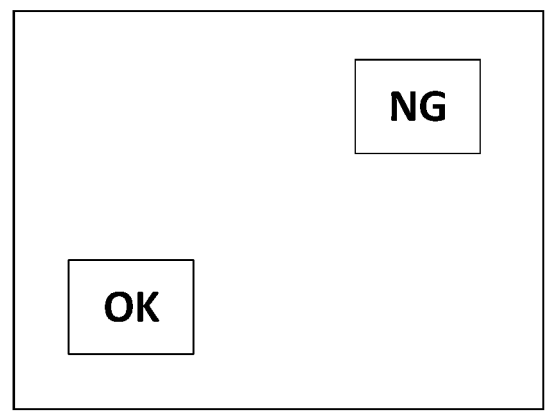
FIG. 1 illustrates a schematic diagram of a display screen in a related OLED display device.

In order to make the purpose, technical solutions and advantages of the embodiments of the present disclosure more clear, the technical solutions in the embodiments of the present disclosure will be clearly and completely described below in conjunction with the drawings in the embodiments of the present disclosure. It is apparent that the described embodiments are part of the embodiments of the present disclosure, and not all. All other embodiments obtained by a person of ordinary skill in the art based on the described embodiments of the present disclosure without creative work should fall within the protection scope of the present disclosure. It should be noted that the same elements are denoted by the same or similar reference numerals throughout the drawings. In the following description, some specific embodiments are for illustrative purposes only, and should not be understood as limiting the disclosure, but only examples of embodiments of the present disclosure.

Conventional structures or configurations will be omitted when they may cause confusion to the understanding of the present disclosure. It should be noted that the shapes and sizes of the various components in the drawings do not reflect the true size and proportions, but merely illustrate the contents of the embodiments of the present disclosure.

Technical or scientific terms used in the embodiments of the present disclosure should be of ordinary meaning as understood by those skilled in the art, unless otherwise defined. The terms "first", "second" and similar words used in the embodiments of the present disclosure do not denote any order, quantity, or importance, but are merely used to distinguish different components.

Furthermore, in the description of the embodiments of the present disclosure, the term "connected" or "connected to" may mean that two components are directly connected, or that two components are connected via one or more other components. In addition, the two components may be connected or coupled in a wired or wireless manner.

In the pixel driving circuit of the OLED display device, at least a switching transistor and a driving transistor are provided for each pixel unit, wherein the switching transistor controls whether a data voltage is applied to a gate of the driving transistor, and the driving transistor converts the data voltage applied to its gate into a corresponding current to cause the light-emitting element to emit light of a corresponding brightness. In the related OLED display device, the phenomenon of local screen flickering and the screen turning purple will appear. FIG. 1 shows a display screen of a related OLED display device obtained by a microscope. As shown in FIG. 1, "NG" indicates a purple display area, that is, an abnormal display area, and "OK" indicates a normal display area. After testing the characteristics of the driving transistors and the switching transistors of the NG region and the OK region, it is found that the cause of the above phenomenon is at least that the negative drift of the switching transistor when it is turned on exceeds the upper limit, and the leakage of the capacitor causes the pixel units surrounding the pixel unit to be turned on or off abnormally.

Further research by the applicant found that the excessively high negative drift of the switching transistor when it is turned on is related to the manufacture process of the associated pixel unit. When manufacturing a pixel unit including a switching transistor and a driving transistor, the switching transistor and the driving transistor generally have the same threshold voltage for process reasons. For example, taking an N-type thin film transistor as an example, the threshold voltage of the driving transistor is required to be in the range of 0 to 1V in consideration of external compensation. However, the threshold voltage of the switching transistor is also in the range of 0 to 1V, which causes the switching transistor to be in a negative bias state when it is turned on periodically, such that the negative drift of the switching transistor exceeds the upper limit.

Figure 2:
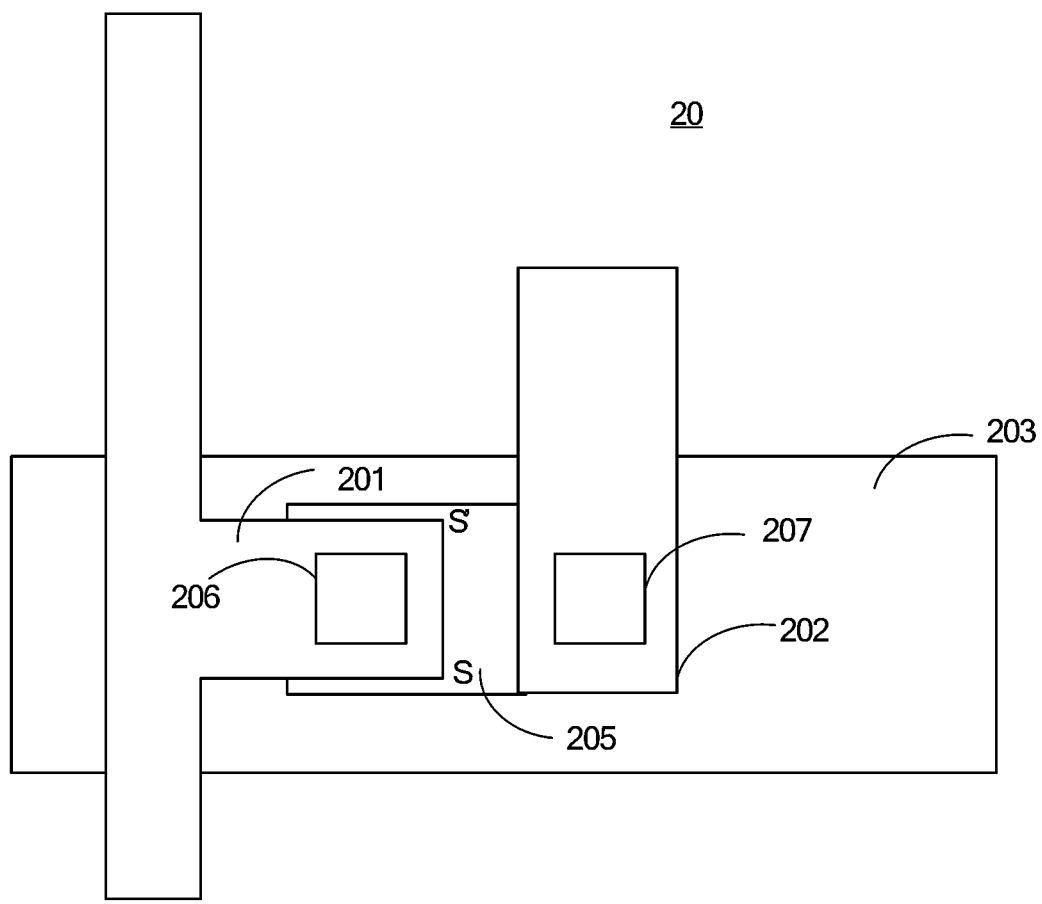
FIG. 2 illustrates a schematic plan view of a related thin film transistor.

Indium Gallium Zinc Oxide (IGZO) is a new generation of materials for the active layer of Thin Film Transistors (TFTs) in the manufacture process of pixel units. The carrier mobility of indium gallium zinc oxide is 5-10 times higher than that of amorphous silicon, which can greatly improve the charge-discharge rate of the pixel electrode. When IGZO is used as the active layer, since the corrosion resistance of IGZO is poor, it is necessary to first form an etching barrier layer on the IGZO active layer to protect the IGZO layer, and then form a source and drain metal electrode layer. FIG. 2 illustrates a schematic plan view of a thin film transistor. As shown in FIG. 2, the thin film transistor 20 may include a source electrode 201, a drain electrode 202, a gate electrode 203, an active layer, and an etching barrier layer 205 on the IGZO active layer, wherein two opposite via 206 and via 207 are disposed on the etching barrier layer 205. The source electrode 201 is electrically connected to the IGZO active layer through the via 206, and the drain electrode 202 is electrically connected to the active layer through the via 207. FIG. 2 is an example in which the thin film transistor 20 is an N-type transistor, that is, the gate electrode 203 is a control electrode, the source electrode 201 is an input electrode, and the drain electrode 202 is an output electrode.

Since the source electrode 201 and the drain electrode 202 are electrically connected to the active layer through the via 206 and the via 207, respectively, the position and size of the via 206 and the via 207 affect the effective width and the effective length of the channel when the TFT is turned on, and then affect the width-length ratio of the channel, and even the threshold voltage Vth of the transistor.

When, for example, the edge S-S' of the via 206 is closer to the channel side, the area of the region in which the input electrode (for example, the source electrode 201 in FIG. 2) and the active layer are overlapped is increased, so that the number of carriers increases corresponding to the increase of the overlap region, which is helpful in turning on the transistor, thus reducing the threshold voltage required to turn on the transistor.

Figure 3:
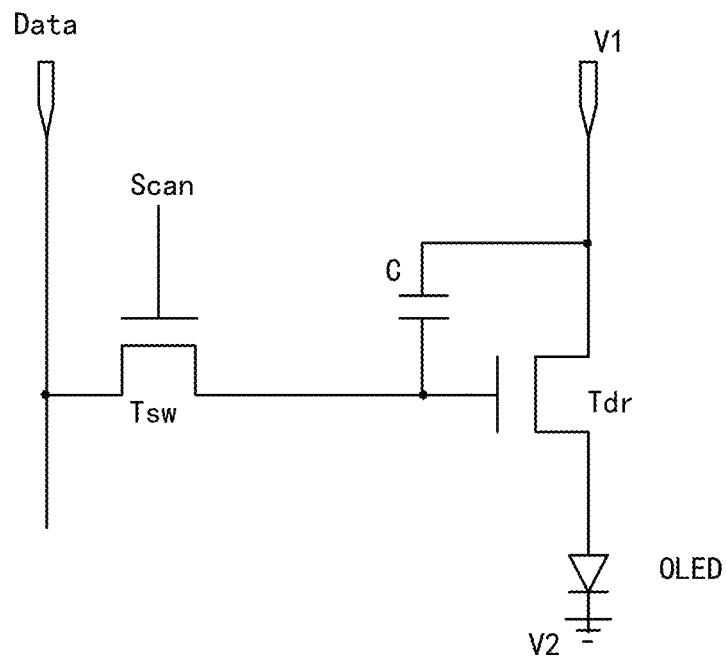
FIG. 3 illustrates a schematic circuit diagram of a pixel unit in accordance with an embodiment of the present disclosure.

According to an embodiment of the present disclosure, a pixel unit is provided. FIG. 3 illustrates a schematic circuit diagram of a pixel unit 30 in accordance with an embodiment of the present disclosure. As shown in FIG. 3, the pixel unit 30 according to an embodiment of the present disclosure may include a driving transistor Tdr, a switching transistor Tsw, and a light emitting element OLED. An input electrode of the driving transistor Tdr is electrically connected to a first power supply terminal V1, and an output electrode of the driving transistor Tdr is electrically connected to a first terminal of the light emitting element OLED. An input electrode of the switching transistor Tsw is electrically connected to a data line Data, a control electrode of the switching transistor Tsw is electrically connected to a scan line Scan, and an output electrode of the switching transistor Tsw is electrically connected to a control electrode of the driving transistor. The switching transistor Tsw and the driving transistor Tdr have different threshold voltages.

In addition, in some embodiments, the switching transistor Tsw and the driving transistor Tdr may be thin film transistors, and in this case, the control electrode may be a gate electrode, the input electrode may be a source electrode, and the output electrode may be a drain electrode. However, the present disclosure is not limited thereto. For example, in some other embodiments, the control electrode may be a gate electrode, the input electrode may be a drain electrode, and the output electrode may be a source electrode. This is at least partially because different types of transistors may have different configurations of their terminals. For example, a P-type transistor may have a source terminal and a drain terminal opposite to those of an N-type transistor, respectively. Therefore, the present disclosure is not limited thereto.

Thus, compared with the non-differential design of the driving transistor and the switching transistor in the related art (for example, it may occur that although the positive bias characteristic of the driving transistor is satisfied, the negative bias characteristic of the switching transistor is affected), in the present embodiment, the threshold voltages of the two are designed to different values (that is, a differential setting of the threshold voltages), so that each transistor can specifically satisfy either a positive bias drift characteristic or a negative bias drift characteristic.

Those skilled in the art will understand that the first power supply terminal V1 may be a voltage signal Vdd. For example, a second terminal of the OLED element may be connected to a second power supply terminal V2. The second power supply terminal V2 may be a voltage signal Vss or grounded. In the example of the N-type thin film transistor, "input electrode" means a source electrode, and "output electrode" means a drain electrode. Those skilled in the art will understand that embodiments of the present disclosure are equally applicable to the cases where P-type thin film transistors are used.

Those skilled in the art will understand that only a basic circuit structure is shown in the above example circuit diagram of the pixel unit. The circuit may further include a storage capacitor C electrically connected between the first power supply terminal V1 and the control electrode of the driving transistor Tdr. When an active level signal is written to the scan line Scan, the switching transistor Tsw is turned on, and at this time the storage capacitor C is charged through the data voltage written to the data line Data until the drive transistor Tdr is turned on, thereby driving the organic electroluminescent diode OLED to emit light. Moreover, those skilled in the art will understand that the circuit may further include, for example, a threshold voltage compensation sub-circuit, a reset sub-circuit, an illumination control sub-circuit, and the like, and the present disclosure is not limited thereto.

Figure 4A:
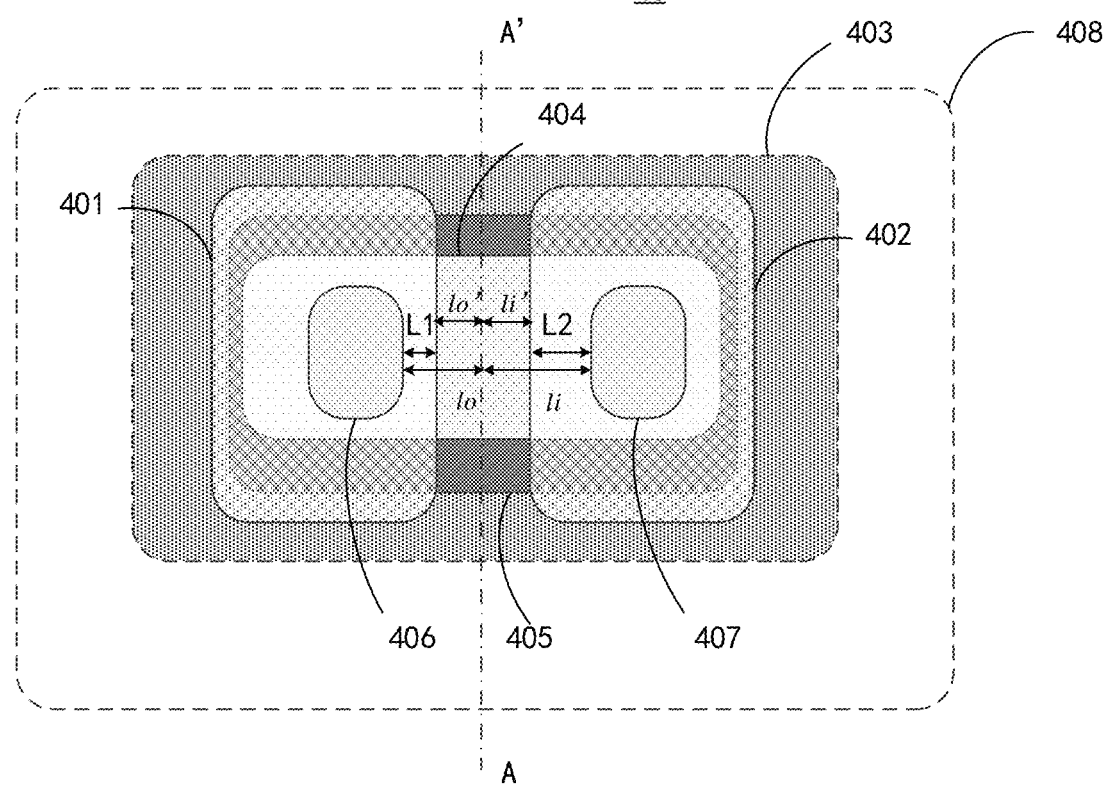
FIG. 4A illustrates a plan view of a thin film transistor in accordance with an embodiment of the present disclosure.

According to an embodiment of the present disclosure, in order for the switching transistor Tsw and the driving transistor Tdr to have different threshold voltages, at least one of the switching transistor Tsw and the driving transistor Tdr may have a thin film transistor structure according to an embodiment of the present disclosure. FIG. 4A illustrates a schematic plan view of a thin film transistor in accordance with an embodiment of the present disclosure. As shown in FIG. 4A, a thin film transistor 40 according to an embodiment of the present disclosure may include an output electrode 401, an input electrode 402, a control electrode 403, an active layer 404, and an etching barrier layer 405 disposed on a substrate 408. As shown in FIG. 4A, the etching barrier layer 405 according to an embodiment of the present disclosure is disposed between the active layer 404 and a layer in which the output electrode 401 and the input electrode 402 are located and has a first via 406 and a second via 407. The output electrode 401 is electrically connected to the active layer 404 through the first via 406, and the input electrode 402 is electrically connected to the active layer 404 through the second via 407. The active layer 404 may be an axisymmetric pattern that is axisymmetric about a first symmetry axis A-A'. However, this axisymmetric pattern may not be perfectly axisymmetric due to a process error, and the process error may be 10% or less. The difference between the minimum distance lo from the edge of the first via 406 to the first symmetry axis A-A' and the minimum distance lo' from the edge of the output electrode 401 to the first symmetry axis A-A' is L1, and the difference between the minimum distance li from the edge of the second via 407 to the first symmetry axis A-A' and the minimum distance li' from the edge of the input electrode 402 to the first symmetry axis A-A' is L2, where L1 and L2 are not equal. In the example of FIG. 4A, L1 is less than L2. Those skilled in the art will understand that in other examples, it is of course possible that L2 is smaller than L1 as long as L1 and L2 are not equal.

Those skilled in the art will understand that "symmetric about the first symmetry axis" may include situations where there is a certain error due to accuracy limitations in the process, for example, tolerances are allowed within a certain range (for example, ±10%). In addition, it should be noted that since the active layer 404 is blocked by the etching barrier layer 405, the active layer 404 and a portion of the etching barrier layer 405 should not be seen in the plan view in practical applications. However, for ease of demonstration, FIG. 4A still schematically illustrated the active layer 404 and the etching barrier layer 405.

Figure 4B:
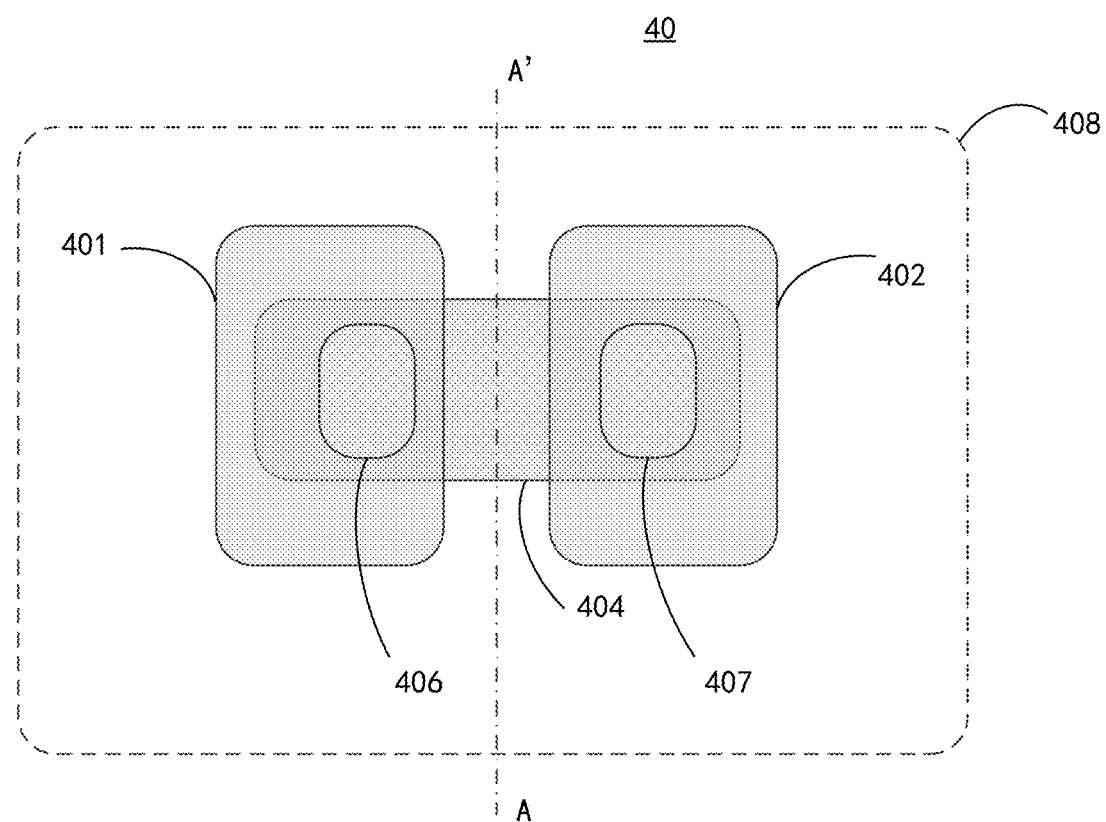
FIG. 4B illustrates a schematic plan view of the thin film transistor of FIG. 4A in accordance with an embodiment of the present disclosure.
Figure 4C:
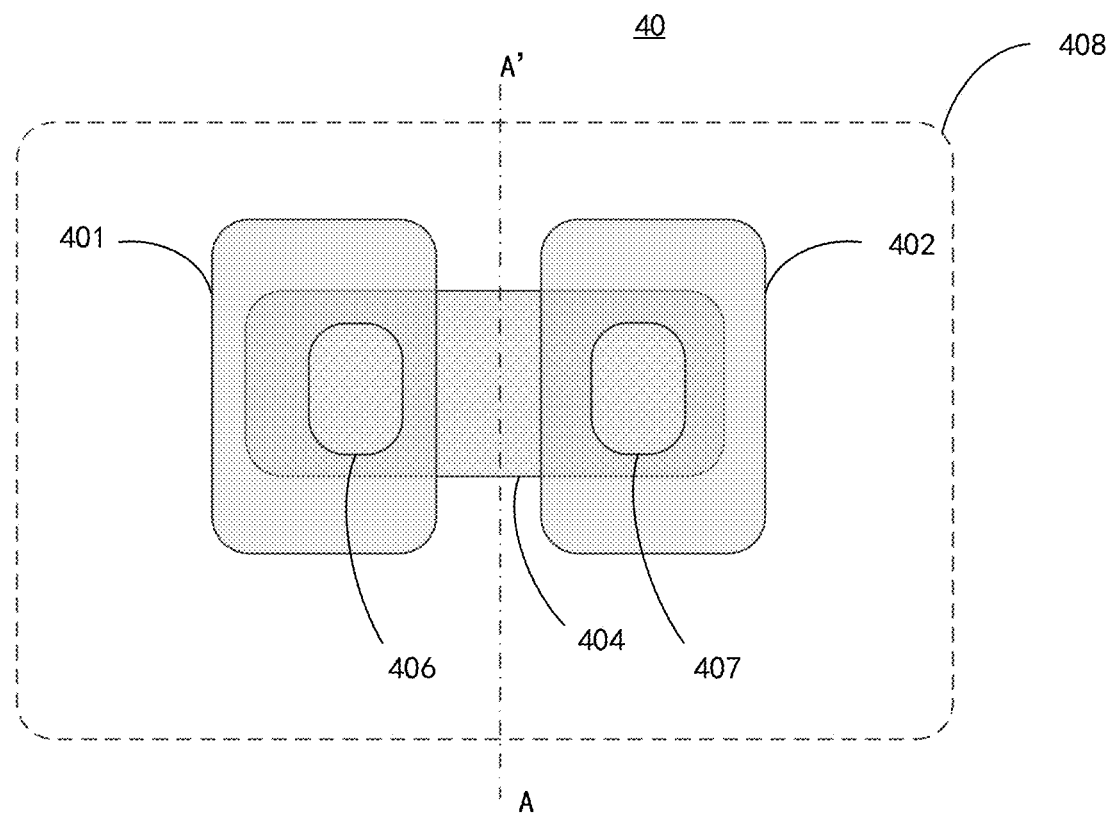
FIG. 4C illustrates another schematic plan view of the thin film transistor of FIG. 4A in accordance with an embodiment of the present disclosure.

FIG. 4B illustrates a schematic plan view of the thin film transistor of FIG. 4A in accordance with an embodiment of the present disclosure. FIG. 4C illustrates another schematic plan view of the thin film transistor of FIG. 4A in accordance with an embodiment of the present disclosure. Those skilled in the art will understand that the control electrode 403 and the etching barrier layer 405 are not shown in FIGS. 4B and 4C for ease of demonstration.

As shown in FIG. 4B, for example, the orthographic projection of the first via 406 on the substrate 408 is located within the orthographic projection area of the output electrode 401 and the active layer 404 on the substrate 408. The orthographic projection of the second via 407 on the substrate 408 is located within the orthographic projection area of the input electrode 402 and the active layer 404 on the substrate 408. The region in which the orthographic projections of the output electrode 401 and the active layer 404 on the substrate 408 are overlapped is a first overlap region, and the region in which the orthographic projections of the input electrode 402 and the active layer 404 on the substrate 408 are overlapped is a second overlap region, the first overlap region and the second overlap region may be axisymmetric about the first symmetry axis A-A'. Those skilled in the art will understand that in this case, for example, the minimum distance lo' from the edge of the output electrode 401 to the first symmetry axis A-A' in the example shown in FIG. 4A is equal to the minimum distance li' from the edge of the input electrode 402 to the first symmetry axis A-A'. Further, as shown in FIG. 4B, the output electrode 401 and the input electrode 402 may be axisymmetric about the first symmetry axis A-A'.

As shown in FIG. 4C, in another example configuration, the first via 406 and the second via 407 may be axisymmetric about the first symmetry axis A-A'.

Those skilled in the art will understand that, depending on the practical applications, the technical solutions of FIG. 4B or FIG. 4C may be adopted to flexibly change L1 and L2.

According to an embodiment of the present disclosure, the first via 406 and the second via 407 are disposed such that $Vth=Vth0+A*(L1-L2)$, wherein $Vth0$ is a reference threshold voltage of the thin film transistor, Vth is a threshold voltage of the thin film transistor, and A is a constant greater than zero. According to an embodiment of the present disclosure, "the reference threshold voltage of the thin film transistor" refers to the threshold voltage achieved when L1 is equal to L2, in the case where the other manufacture conditions of the thin film transistor are unchanged compared to the respective manufacture conditions at the actual threshold voltage of the thin film transistor.

In an example, when L1 is equal to L2, assuming that $L1=L2=2$ μm, the reference threshold voltage $Vth0$ may be achieved to be 1.6V. In the case where the manufacturing process and material of the transistor are constant, L1 and L2 are changed, for example, by changing the mask pattern for the etching barrier layer, such that L1 is, for example, 1 μm, L2 is, for example, 3 μm, and A is 0.6, then $Vth=1.6V+0.6*(L1-L2)=0.4V$, whereby different threshold voltages Vth may be achieved. In an example, L1 is in the range of 0.8 μm to 1.2 μm, and L2 is in the range of 2.8 μm to 3.2 μm. Those skilled in the art will understand that the numerical values of the size, the voltage, and the like in the embodiments of the present disclosure are merely examples, and may certainly be other values according to practical applications. Moreover, the numerical values mentioned in the embodiments of the present disclosure are not completely accurate, and tolerances are allowed within a certain range (for example, ±20%).

The first via 406 and the second via 407 may be implemented as rectangles with rounded corners. The shape and area of the first via 406 and the second via 407 may be the same. The active layer 404 may be an indium gallium zinc oxide (IGZO) thin film layer. In practical applications, the material of the active layer may not be limited to IGZO.

Further, the etching barrier layer 405 may include a silicon oxide (SiOx) thin film layer, or a silicon nitride (SiNx) thin film layer, or a composite layer formed of silicon oxide (SiOx) and silicon nitride (SiNx).

According to an embodiment of the present disclosure, the structure of the thin film transistor may include a bottom gate type structure and/or a top gate type structure, wherein the bottom gate type structure is as follows: a gate electrode, a gate insulating layer, an active layer, an etching barrier layer, and a source and drain electrode layer are sequentially disposed from the side of the substrate used to dispose the thin film transistor. The top gate type structure is as follows: an active layer, an inter-layer insulation layer, a source and drain electrode layer, a gate insulating layer, and a gate electrode are sequentially disposed from the side of the substrate used to dispose the thin film transistor. It should be noted that the thin film transistor in the embodiment of the present disclosure is described by taking a bottom gate type thin film transistor (that is, the gate electrode is located below the active layer pattern) as an example, which is merely an exemplary description. In a practical application, the structure of the thin film transistor may be changed as needed. The thin film transistor according to the present disclosure may also adopt a top gate type array substrate, that is, the gate electrode is located above the active layer pattern.

By changing the mask pattern for the etching barrier layer or the inter-layer insulation layer (or more generally, the insulation layer) to change L1 and L2, the threshold voltage of the thin film transistor may be designed according to practical needs, thereby flexibly realizing the desired threshold voltage in the case where the manufacturing materials and processes of the thin film transistor are hardly changed. For example, the absolute value of the difference between L1 and L2 of one of the switching transistor and the driving transistor is greater than the absolute value of the difference between L1 and L2 of the other transistor. For example, the difference between L1 and L2 of one of the switching transistor and the driving transistor is not zero, and the difference between L1 and L2 of the other transistor is zero.

The pixel unit according to an embodiment of the present disclosure may be flexibly disposed such that the threshold voltage of the switching transistor Tsw is greater than the threshold voltage of the driving transistor Tdr. For example, in order to cooperate with external compensation, it is generally required that the Vth of the driving transistor Tdr is in the range of 0 to 1V. Therefore, the driving transistor Tdr may be designed to have a structure in which L1 is 1 μm and L2 is 3 μm, so that the Vth of Tdr is 0.4V. Meanwhile, the switching transistor Tsw may be designed to have a structure in which L1 is 2 μm and L2 is 2 μm, so that the Vth of Tsw is 1.6V. Conversely, the driving transistor Tdr may also be designed to have a structure in which L1 is 2 1 μm and L2 is 2 μm, so that the Vth of Tdr is 0.4V. Meanwhile, the switching transistor Tsw may be designed to have a structure in which L1 is 3 μm and L2 is 1 μm, so that the Vth of Tsw is Vth=0.4V+0.6*(L1−L2)=1.6V.

Thus, in the same pixel unit, the threshold voltage of the driving transistor is significantly lower than that of the switching transistor, so that the forward bias characteristic of the driving transistor may be ensured while the negative bias characteristic of the switching transistor may also be taken into account. Those skilled in the art will appreciate that in a typical OLED pixel circuit, a drive transistor, such as an oxide transistor, typically operates with a positive voltage, while a switching transistor typically operates at a negative voltage. The applicant found that by designing the threshold voltage of the driving transistor as a lower value, and the threshold voltage of the switching transistor as a higher value, the threshold voltage drift of the two transistors may be specifically mitigated, and the forward bias characteristic of the driving transistor may be ensured while the negative bias characteristic of the switching transistor may also be taken into account. This further alleviates the phenomenon of the screen turning purple caused by the excessive negative drift of the threshold voltage of the switching transistor.

Figure 5:
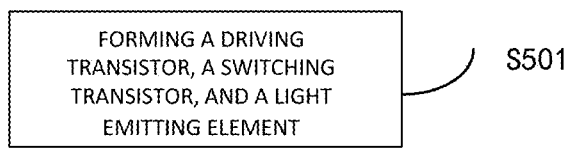
FIG. 5 illustrates a schematic flowchart of a method of manufacturing a pixel unit according to an embodiment of the present disclosure.

According to an embodiment of the present disclosure, a method of manufacturing a pixel unit is also provided. FIG. 5 illustrates a flowchart of a method 50 of manufacturing a pixel unit according to an embodiment of the present disclosure. As shown in FIG. 5, the method 50 of manufacturing a pixel unit according to an embodiment of the present disclosure may include the following steps.

In step S501, a driving transistor, a switching transistor, and a light emitting element are formed.

According to an embodiment of the present disclosure, forming at least one of the switching transistor and the driving transistor may include:
  forming a gate electrode;
  forming an active layer;
  forming an etching barrier layer;
  forming a first via and a second via on the etching barrier layer; and
  forming an input electrode and an output electrode,
  wherein the forming the first via and the second via on the etching barrier layer includes: forming the first via and the second via by translating a mask for the etching barrier layer by a distance of |L1−L2|.

Those skilled in the art will understand that, by translating the mask for the etching barrier layer by a distance of |L1−L2| in the formation of the first via and the second via, the pattern of the mask does not need to be changed, thus saving the cost.

Figure 6:
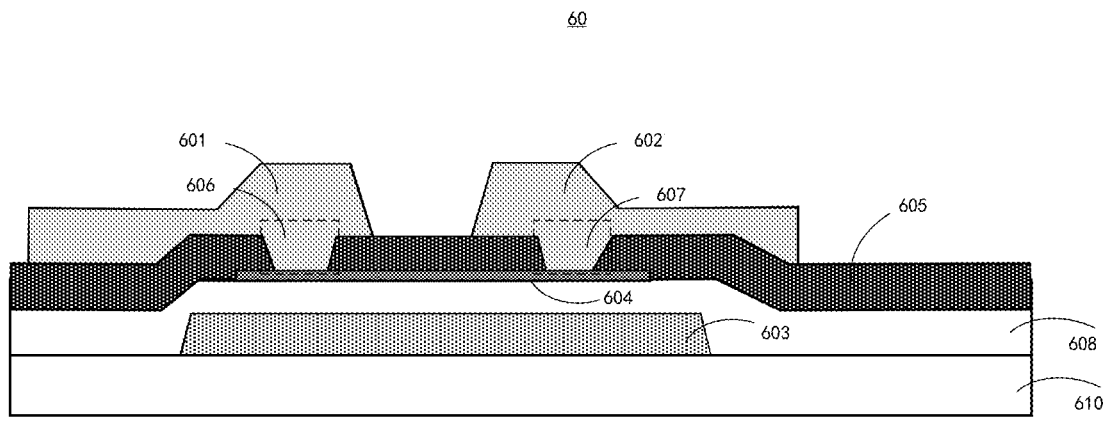
FIG. 6 illustrates a schematic diagram of a method of manufacturing a thin film transistor in a pixel unit according to an embodiment of the present disclosure.

FIG. 6 illustrates a schematic diagram of manufacturing a pixel unit according to an embodiment of the present disclosure. A method of manufacturing a pixel unit according to an embodiment of the present disclosure will be described in detail below with reference to FIGS. 5 and 6. For the sake of brevity, the manufacture of a pixel unit including a thin-film transistor according to the embodiments of the present disclosure is described as an example in the following description. Further, the manufacture of a bottom gate type thin film transistor 60 is described as an example.

As shown in FIG. 6, first, a gate electrode 603 is formed on a substrate 610. For example, the substrate 610 may be a transparent glass substrate, and 50 to 400 nm of Mo or Mo/Al/Mo or MoNb/Cu may be deposited as a gate layer by sputtering or evaporation, and then patterned as needed. Next, the active layer 604 is formed. For example, IGZO having a thickness of 10 to 80 nm may be deposited by sputtering, and lithography and etching may be performed as needed. An etching barrier layer 605 is then fabricated on the active layer 604 to protect the active layer 604 from being affected by the etchant or moisture. For example, SiOx having a thickness of 200 nm, and SiNx or SiOxNy having a thickness of 100 nm on SiOx may be deposited as the etching barrier layer by plasma enhanced chemical vapor deposition (PECVD) or sputtering, and then patterned as needed, thus manufacturing the etching barrier layer 605 on the active layer 604. The first via 606 and the second via 607 are disposed on the etching barrier layer 605 by, for example, dry etching or other methods. Then the source and drain metal layer is formed on the etching barrier layer 605, for example, Mo or Mo/Al/Mo or MoNb/Cu having a thickness of 50 to 400 nm is formed by sputtering as the source and drain electrode layer, and lithography and etching are performed according to a desired pattern, thus forming a desired shape of the drain electrode 601 and the source electrode 602.

The first via 606 and the second via 607 pass through the etching barrier layer 605 such that the source and drain electrodes above the etching barrier layer 605 may be electrically connected to the active layer 604 under the etching barrier layer 605. The size of the vias and the distance between the vias are determined by the process capability of the factory, for example, the alignment accuracy of the vias and the source and drain electrodes, the minimum etching width of the source and drain electrodes, and the minimum etching width of the vias.

It will be understood by those skilled in the art that although not shown in FIG. 6, the thin film transistor according to an embodiment of the present disclosure may further include a structure of a gate insulating layer 608, a passivation layer, a flat layer, a color film layer, and the like. For example, SiOx having a thickness of 100 to 500 nm may be prepared by PECVD as the gate insulating layer 608. Embodiments of the present disclosure are not limited thereto.

Figure 7A:
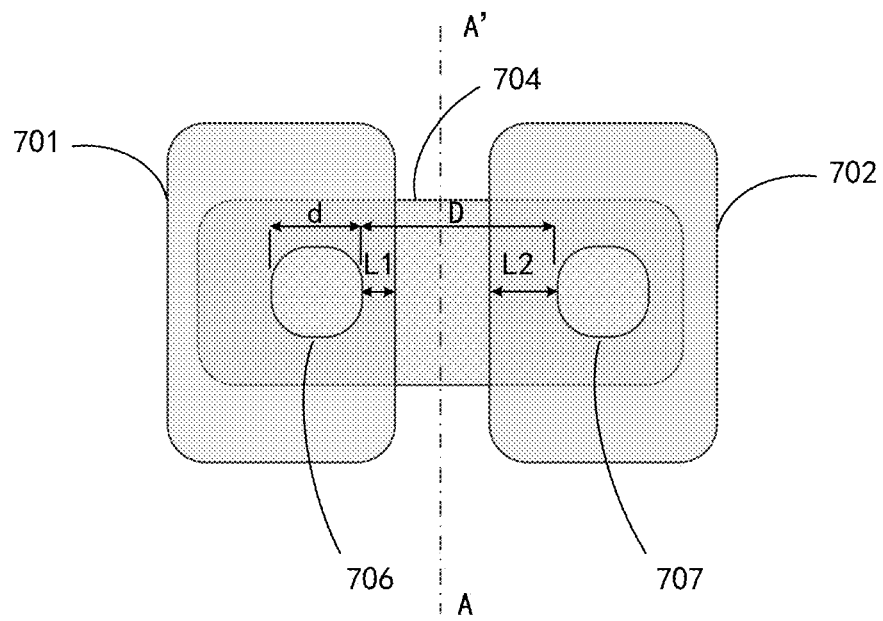
FIG. 7A is a schematic plan view of a thin film transistor according to an example of the present disclosure.

FIG. 7A is a schematic plan view of a thin film transistor according to an example of the present disclosure. Similarly, for ease of demonstration, the etching barrier layer, the gate electrode, and the substrate are not shown in FIG. 7A. In the example shown in FIG. 7A, for example, each of the first via 706 connecting the output electrode 701 and the active layer 704 and the second via 707 connecting the input electrode 702 and the active layer 704 is formed as a round-corner square having a side length d of 4 μm. In the actual manufacture process of the thin film transistor, due to the minimum precision of the exposure machine and the influence of imaging, development, and etching, the formed via has a certain deformation, and the actually formed via is a round-corner rectangle, or even close to a circle. The distance D between the edge of the first via 706 and the edge of the second via 707 is 8 μm. The difference L1 between the minimum distance from the edge of the first via 706 to the first symmetry axis and the minimum distance from the edge of the output electrode 701 to the first symmetry axis is 1 μm, and the difference L2 between the minimum distance from the edge of the second via 707 to the first symmetry axis and the minimum distance from the edge of the input electrode 702 to the first symmetry axis is 3 μm. Since the output electrode 701 and the input electrode 702 are electrically connected to the active layer 604 through the vias 706 and 707, respectively, the width of the channel is determined by the diameter of the vias. Therefore, the width of the channel in the example is the diameter of the vias, that is, 4 μm. In the case where L1 and L2 are equal in the prior art, the channel length of the thin film transistor is the distance D between the first via 706 and the second via 707, which is equal to 8 μm. However, according to an embodiment of the present disclosure, since L1 and L2 are not equal, the electric field between the output electrode 701 and the active layer 704 and the electric field between the input electrode 702 and the active layer 704 are changed. Thus the effective length of the channel is not 8 μm, but changes correspondingly based on the difference between L1 and L2, so that the Vth of the thin film transistor satisfies Vth=Vth0+A*(L1−L2), where A is a constant greater than zero, and Vth0 is the reference threshold voltage of the thin film transistor, that is, the threshold voltage achieved when L1 is equal to L2, in the case where the other manufacture conditions of the thin film transistor are unchanged.

Figure 7B:
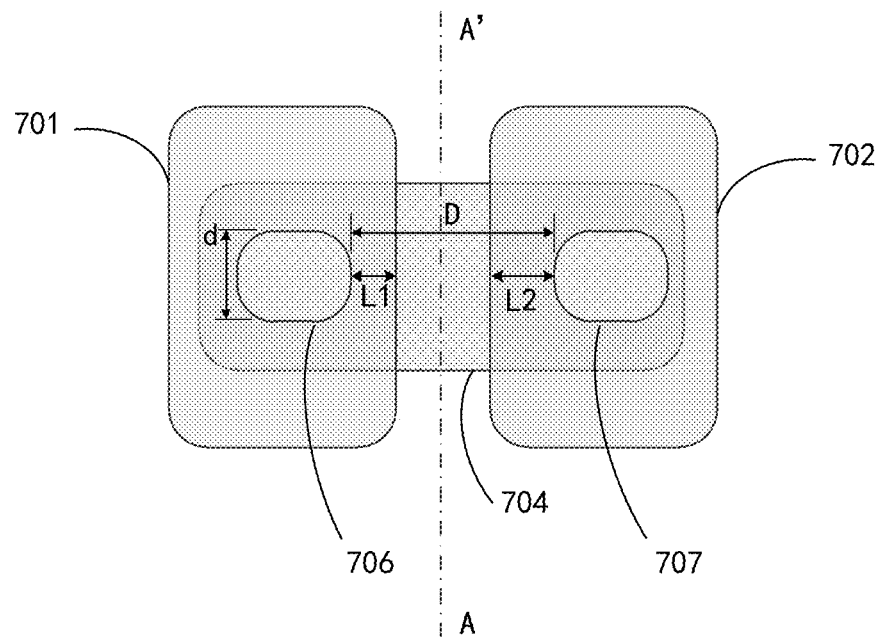
FIG. 7B is a schematic plan view of a thin film transistor according to another example of the present disclosure.

FIG. 7B is a schematic plan view of a thin film transistor according to another example of the present disclosure. Similarly, for ease of demonstration, the etching barrier layer, the gate electrode, and the substrate are not shown in FIG. 7B. In the example shown in FIG. 7B, for example, each of the first via 706 connecting the output electrode 701 and the active layer 704 and the second via 707 connecting the input electrode 702 and the active layer 704 is formed as a round-corner rectangle having a length of 7 μm and a width of 4 μm. The shortest distance D between the edge of the first via 706 and the edge of the second via 707 is still 8 μm. The difference L1 between the minimum distance from the edge of the first via 706 to the first symmetry axis and the minimum distance from the edge of the output electrode 701 to the first symmetry axis is 1 still μm, and the difference L2 between the minimum distance from the edge of the second via 707 to the first symmetry axis and the minimum distance from the edge of the input electrode 702 to the first symmetry axis is still 3 μm. In the example shown in FIG. 7B, the effective width of the channel is determined by the width of the vias. Therefore, the effective channel width in the example is the width of the vias, that is, 4 μm. Since L1 and L2 are not equal, the electric field between the output electrode 701 and the active layer 704 and the electric field between the input electrode 702 and the active layer 704 are changed. Thus the effective length of the channel is not 8 μm, but changes correspondingly based on the difference between L1 and L2, so that the Vth of the thin film transistor satisfies Vth=Vth0+A*(L1−L2), where A is a constant greater than zero, and Vth0 is the reference threshold voltage of the thin film transistor, that is, the threshold voltage achieved when L1 is equal to L2, in the case where the other manufacture conditions of the thin film transistor are unchanged.

For ease of description, the examples of FIGS. 7A and 7B both show the case where the first overlap region of the orthographic projections of the output electrode 701 and the active layer 704 on the substrate and the second overlap region of the orthographic projections of the input electrode 702 and the active layer 704 on the substrate are axisymmetric about the first symmetric axis A-A'. Further, the output electrode 701 and the input electrode 702 are also axisymmetric about the first symmetry axis A-A'. It will be understood by those skilled in the art that the embodiments of the present disclosure may also be implemented such that the first via 706 and the second via 707 are axisymmetric about the first symmetry axis A-A', and embodiments of the present disclosure are not limited thereto.

Figure 8:
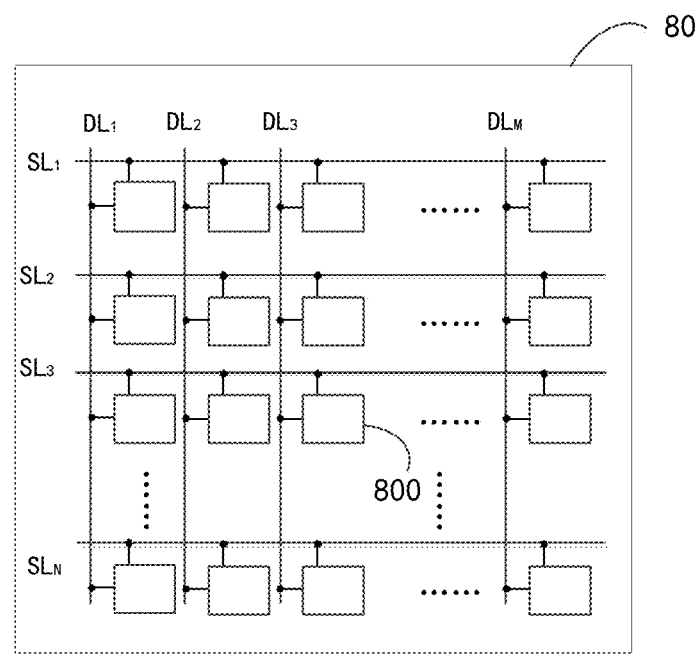
FIG. 8 is a schematic diagram of an array substrate in accordance with an embodiment of the present disclosure.

According to another aspect of the present disclosure, an array substrate is also provided. FIG. 8 illustrates an array substrate 80 in accordance with an embodiment of the present disclosure. As shown in FIG. 8, the array substrate 80 according to an embodiment of the present disclosure may include: a plurality of scan lines $SL_1$-$SL_N$; a plurality of data lines $DL_1$-$DL_M$; and a plurality of pixel units 800 according to an embodiment of the present disclosure arranged in an array.

According to yet another aspect of the present disclosure, a display device comprising an array substrate as described above is also provided.

According to the technical solution of the embodiments of the present disclosure, transistors having different threshold voltages are designed according to different functions of the driving transistor and the switching transistor in the pixel unit. The driving circuit in the pixel unit can be customized according to actual display requirements, and the threshold voltages of the driving transistor and the switching transistor in the pixel unit are specifically designed, so as to improve the display effect.

It is to be understood that the above embodiments are merely exemplary embodiments employed to explain the principles of the present disclosure, but the present disclosure is not limited thereto. Various modifications and improvements may be made by those skilled in the art without departing from the spirit and scope of the present disclosure, and such modifications and improvements are also considered to be within the scope of the present disclosure.

We claim:

1. A pixel circuit comprising:
   a driving transistor, a switching transistor, and a light emitting element on a substrate;
   wherein the driving transistor has an input electrode electrically connected to a first power supply terminal and an output electrode electrically connected to a first terminal of the light emitting element;
   wherein the switching transistor has an input electrode electrically connected to a data line, a control electrode electrically connected to a scan line, and an output electrode electrically connected to a control electrode of the driving transistor;

wherein the switching transistor has a different threshold voltage from that of the driving transistor; and wherein each of the switching transistor and the driving transistor further comprises:
an active layer; and
an insulation layer,
wherein the insulation layer comprises a first via and a second via, and the output electrode and the input electrode are electrically connected to the active layer through the first via and the second via, respectively;
wherein for the switching transistor and/or the driving transistor, the active layer is an axisymmetric pattern that is axisymmetric about a first symmetry axis; and
wherein a difference between a minimum distance from an edge of the first via to the first symmetry axis and a minimum distance from an edge of the output electrode to the first symmetry axis is L1, and a difference between a minimum distance from an edge of the second via to the first symmetry axis and a minimum distance from an edge of the input electrode to the first symmetry axis is L2, and L1 is not equal to L2 for the switching transistor and/or the driving transistor.

2. The pixel circuit of claim 1, wherein for the switching transistor and/or the driving transistor, an orthographic projection of the first via on the substrate is located within an orthographic projection area of the output electrode and the active layer on the substrate, and an orthographic projection of the second via on the substrate is located within an orthographic projection area of the input electrode and the active layer on the substrate.

3. The pixel circuit of claim 1, wherein for the switching transistor and/or the driving transistor, a region in which orthographic projections of the output electrode and the active layer on the substrate are overlapped is a first overlap region, and a region in which orthographic projections of the input electrode and the active layer on the substrate are overlapped is a second overlap region, and wherein the first overlap region and the second overlap region are axisymmetric about the first symmetry axis.

4. The pixel circuit of claim 1, wherein for the switching transistor and/or the driving transistor, the first via and the second via are axisymmetric about the first symmetry axis.

5. The pixel circuit of claim 1, wherein for the switching transistor and/or the driving transistor, the output electrode and the input electrode are axisymmetric about the first symmetry axis.

6. The pixel circuit of claim 1, wherein for the switching transistor and/or the driving transistor, the first via and the second via are disposed such that Vth=Vth0+A*(L1−L2), where Vth0 is a reference threshold voltage of the at least one transistor, Vth is a threshold voltage of the thin film transistor, and A is a constant greater than zero.

7. The pixel circuit of claim 1, wherein one of L1 or L2 is in a range of 2.8 μm to 3.2 μm, and the other is in a range of 0.8 μm to 1.2 μm.

8. The pixel circuit of claim 1, wherein an absolute value of a difference between L1 and L2 of one of the switching transistor or the driving transistor is greater than an absolute value of a difference between L1 and L2 of the other transistor.

9. The pixel circuit of claim 8, wherein the difference between L1 and L2 of one of the switching transistor or the driving transistor is not zero, and the difference between L1 and L2 of the other transistor is zero.

10. The pixel circuit of claim 1, wherein for the switching transistor and/or the driving transistor, the control electrode is a gate electrode, the input electrode is a source electrode, and the output electrode is a drain electrode.

11. The pixel circuit of claim 1, wherein a threshold voltage of the switching transistor is greater than a threshold voltage of the driving transistor.

12. An array substrate comprising:
a plurality of scan lines;
a plurality of data lines; and
a plurality of pixel circuits of claim 1 arranged in an array.

13. A display device comprising an array substrate of claim 12.

14. A method of manufacturing a pixel circuit, the method comprising:
forming a driving transistor, a switching transistor, and a light emitting element;
wherein forming the switching transistor and/or the driving transistor comprises:
forming a gate electrode;
forming an active layer, the active layer being an axisymmetric pattern that is axisymmetric about a first symmetry axis;
forming an insulation layer;
forming a first via and a second via on the insulation layer; and
forming an input electrode and an output electrode,
wherein forming the first via and the second via on the insulation layer comprises:
forming the first via and the second via by translating a mask for the insulation layer by a distance of |L1−L2|,
wherein a difference between a minimum distance from an edge of the first via to the first symmetry axis and a minimum distance from an edge of the output electrode to the first symmetry axis is L1, and a difference between a minimum distance from an edge of the second via to the first symmetry axis and a minimum distance from an edge of the input electrode to the first symmetry axis is L2.

15. The method of claim 14, wherein one of L1 or L2 is in a range of 2.8 μm to 3.2 μm, and the other is in a range of 0.8 μm to 1.2 μm.

16. The method of claim 14, wherein an absolute value of a difference between L1 and L2 of one of the switching transistor or the driving transistor is greater than an absolute value of a difference between L1 and L2 of the other transistor.

17. The method of claim 14, wherein a difference between L1 and L2 of one of the switching transistor or the driving transistor is not zero, and a difference between L1 and L2 of the other transistor is zero.

* * * * *